(12) United States Patent
Oka

(10) Patent No.: US 11,546,970 B2
(45) Date of Patent: Jan. 3, 2023

(54) PLASMA PROCESSING APPARATUS AND TEMPERATURE CONTROL METHOD

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 185 days.

(21) Appl. No.: 16/872,632

(22) Filed: May 12, 2020

(65) Prior Publication Data

US 2020/0367320 A1 Nov. 19, 2020

(30) Foreign Application Priority Data

May 13, 2019 (JP) .............................. JP2019-090851

(51) Int. Cl.

| H05B 3/68 | (2006.01) |
| H05B 1/02 | (2006.01) |
| H01J 37/32 | (2006.01) |
| H01L 21/3065 | (2006.01) |
| H01L 21/67 | (2006.01) |

(52) U.S. Cl.
CPC ...... H05B 1/0233 (2013.01); H01J 37/32724 (2013.01); H01J 37/32926 (2013.01); H01L 21/3065 (2013.01); H01L 21/67063 (2013.01); H01L 21/67248 (2013.01); *H01J 2237/3341* (2013.01)

(58) Field of Classification Search
CPC ......... H01J 2237/3341; H01J 37/32724; H01J 37/32926; H01L 21/3065; H01L 21/67011; H01L 21/67063; H01L 21/67098; H01L 21/67248; H05B 1/0233; H05B 3/283
USPC ............................................ 219/443.1–444.1
See application file for complete search history.

(56) References Cited

U.S. PATENT DOCUMENTS

| 2007/0084847 A1* | 4/2007 | Koshimizu | ............... G01K 5/48 219/390 |
| 2016/0378092 A1* | 12/2016 | Yamamoto | ........... G05B 19/404 700/300 |
| 2017/0140954 A1 | 5/2017 | Kitagawa et al. | |
| 2019/0362991 A1* | 11/2019 | Mungekar | .......... G05B 19/4155 |

FOREIGN PATENT DOCUMENTS

JP 2016-001688 A 1/2016

* cited by examiner

*Primary Examiner* — Sang Y Paik
(74) *Attorney, Agent, or Firm* — Weihrouch IP

(57) ABSTRACT

A plasma processing apparatus includes a stage having a placing surface on which a workpiece is accommodated; a heater provided in the stage and configured to adjust a temperature of the placing surface of the stage; and a controller. The controller is configured to control a supply power to the heater; measure the supply power in a transient state where the supply power to the heater increases and in a second steady state where the supply power to the heater is stable in an extinguished state of plasma; calculate a heat input amount and a heat resistance by performing a fitting on a calculation model that calculates the supply power in the transient state using the heat input amount from the plasma and the heat resistance between the workpiece and the heater as parameters; and calculate a temperature of the workpiece in the first steady state.

9 Claims, 10 Drawing Sheets

PLASMA PROCESSING APPARATUS AND TEMPERATURE CONTROL METHOD

CROSS-REFERENCE TO RELATED APPLICATIONS

This application is based on and claims priority from Japanese Patent Application No. 2019-090851, filed on May 13, 2019, with the Japan Patent Office, the disclosure of which is incorporated herein in its entirety by reference.

TECHNICAL FIELD

The present disclosure relates to a plasma processing apparatus, a temperature control method, and a temperature control program.

BACKGROUND

Japanese Patent Laid-Open Publication No. 2016-001688 proposes a technique in which a temperature-controllable heater is embedded in a stage on which a semiconductor wafer is placed, and the temperature of the semiconductor wafer is controlled by the heater.

SUMMARY

According to an aspect of the present disclosure, a plasma processing apparatus includes a stage, a heater controller, a measurement unit, a parameter calculator, and a temperature calculator. The stage is provided with a placing surface on which a workpiece to be subjected to a plasma processing is placed, and a heater capable of adjusting a temperature of the placing surface. The heater controller is configured to control a supply power supplied to the heater such that the heater reaches a set temperature. The measurement unit is configured to, while the heater controller controls the supply power supplied to the heater to make the temperature of the heater constant, measure supply powers in a transient state where the supply power supplied to the heater increases after a shifting to a state where plasma is extinguished from a first steady state where the supply power supplied to the heater is stable in an ignited state of plasma, and in a second steady state where the supply power supplied to the heater is stable in an extinguished state of plasma. The parameter calculator is configured to perform a fitting using the supply powers in the transient state and the second steady state measured by the measurement unit, with respect to a calculation model that calculates the supply power in the transient state using a heat input amount from the plasma and a heat resistance between the workpiece and the heater as parameters, thereby calculating the heat input amount and the heat resistance. The temperature calculator is configured to calculate a temperature of the workpiece in the first steady state, using the heat input amount and the heat resistance calculated by the parameter calculator.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a plasma processing apparatus, a temperature control method, and a temperature control program according to the present disclosure will be described in detail with reference to the drawings. In the present disclosure, an apparatus that performs a plasma etching will be described in detail as a specific example of the plasma processing apparatus. In addition, the plasma processing apparatus, the temperature control method, and the temperature control program are not limited by the embodiments.

Meanwhile, a plasma processing apparatus has been known which performs a plasma processing such as etching on a workpiece such as a semiconductor wafer (hereinafter, also referred to as a "wafer") using plasma. In the plasma processing apparatus, the temperature of the wafer is one of important parameters for the etching process.

However, in the plasma processing, heat is input from plasma toward the wafer. Accordingly, in the plasma processing apparatus, the temperature of the wafer may not be accurately obtained during the plasma processing.

Thus, in the plasma processing apparatus, a technology capable of accurately obtaining the temperature of the workpiece during the plasma processing is expected.

[Configuration of Plasma Processing Apparatus]

Figure 1:
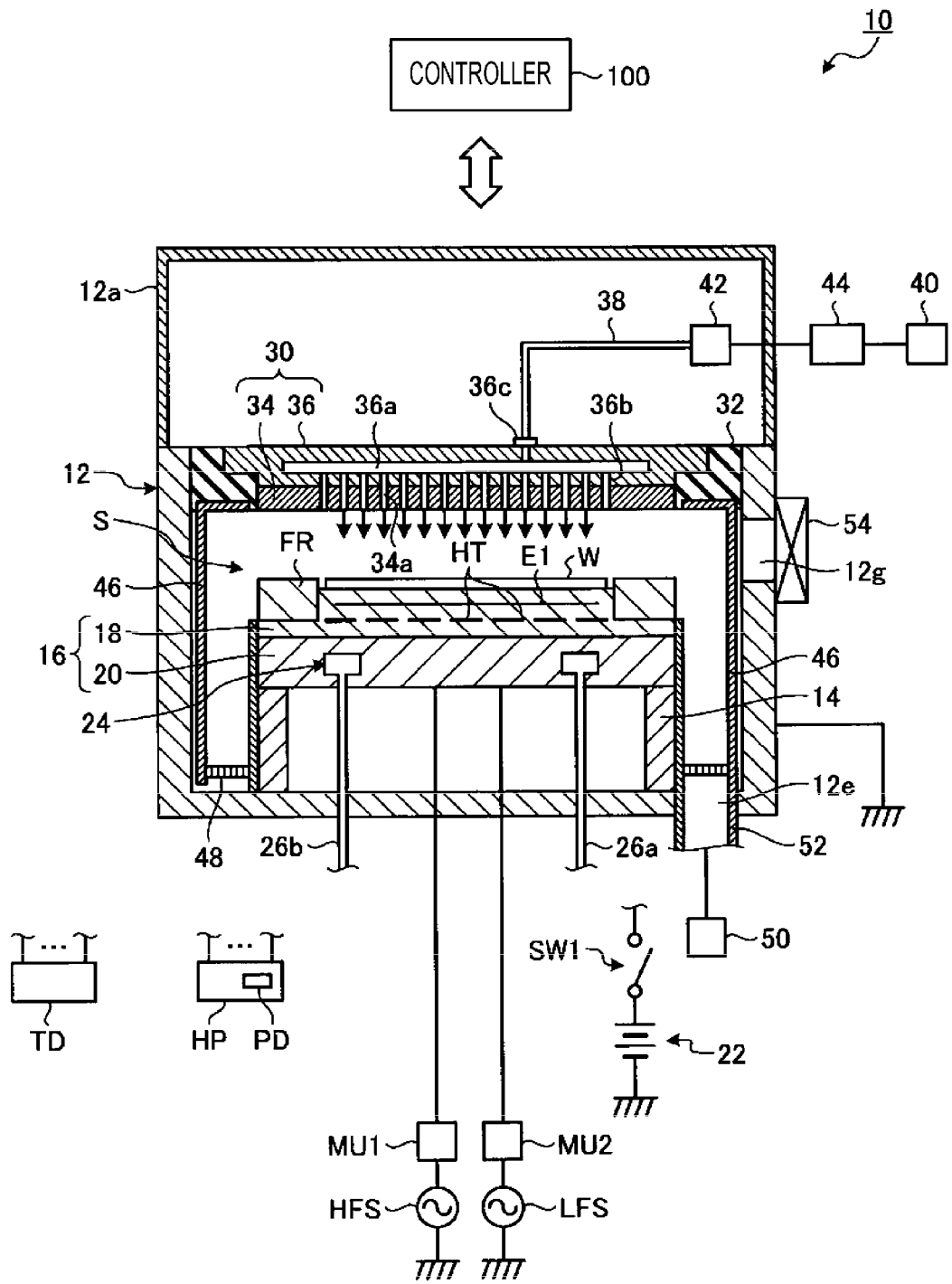
FIG. 1 is a cross-sectional view illustrating an example of a schematic configuration of a plasma processing apparatus according to an embodiment.

First, a configuration of a plasma processing apparatus 10 according to an embodiment will be described. FIG. 1 is a cross-sectional view illustrating an example of a schematic configuration of a plasma processing apparatus according to an embodiment. FIG. 1 schematically represents the structure of the plasma processing apparatus 10 according to the embodiment, in view of the vertical cross section thereof. The plasma processing apparatus 10 illustrated in FIG. 1 is a capacitively coupled parallel-plate plasma etching apparatus. The plasma processing apparatus 10 includes a substantially cylindrical processing container 12. The processing container 12 is made of, for example, aluminum. Further, the surface of the processing container 12 is anodized.

A stage 16 is provided inside the processing container 12. The stage 16 includes an electrostatic chuck 18 and a base 20. The upper surface of the electrostatic chuck 18 serves as a placing surface on which a workpiece to be subjected to a plasma processing is placed. In the present embodiment, a wafer W is placed as the workpiece on the upper surface of the electrostatic chuck 18. The base 20 has a substantially disc shape, and the main portion of the base 20 is made of a conductive metal such as, for example, aluminum. The base 20 makes up a lower electrode. The base 20 is supported by a support 14. The support 14 is a cylindrical member that extends from the bottom of the processing container 12.

A first radio-frequency power supply HFS is electrically connected to the base 20 via a matching unit MU1. The first radio-frequency power supply HFS is a power supply that generates a radio-frequency power for generating plasma, and generates a radio-frequency power of 27 MHz to 100 MHz, for example, 40 MHz. As a result, plasma is generated directly above the base 20. The matching unit MU1 includes a circuit for matching an output impedance of the first radio-frequency power supply HFS and an input impedance of a load side (the base 20) with each other.

Further, a second radio-frequency power supply LFS is electrically connected to the base 20 via a matching unit MU2. The second radio-frequency power supply LFS generates a radio-frequency power for drawing ions into the wafer W (a radio-frequency bias power), and supplies the radio-frequency bias power to the base 20. As a result, a bias potential is generated on the base 20. The frequency of the radio-frequency bias power falls within a range of 400 kHz to 13.56 MHz (e.g., 3 MHz in an example). The matching unit MU2 includes a circuit for matching an output impedance of the second radio-frequency power supply LFS and an input impedance of a load side (the base 20) with each other.

The electrostatic chuck 18 is provided on the base 18b. The electrostatic chuck 18 adsorbs the wafer W by an electrostatic force such as a Coulomb force, thereby holding the wafer W thereon. An electrode E1 for the electrostatic adsorption is provided inside the ceramic main body of the electrostatic chuck 18. A DC power supply 22 is electrically connected to the electrode E1 via a switch SW1. The adsorption force for holding the wafer W relies on a value of a DC voltage applied from the DC power supply 22.

A focus ring FR is disposed above the upper surface of the base 20 and around the electrostatic chuck 18. The focus ring FR is provided to improve the uniformity of the plasma processing. The focus ring FR is made of a material appropriately selected according to a plasma processing to be performed. For example, the focus ring FR is made of silicon or quartz.

A coolant flow path 24 is formed inside the base 20. A coolant is supplied to the coolant flow path 24 from a chiller unit provided outside the processing container 12 through a pipe 26a. The coolant supplied to the coolant flow path 24 returns to the chiller unit through a pipe 26b.

An upper electrode 30 is provided in the processing container 12. The upper electrode 30 is disposed above the stage 16 while facing the base 20. The base 20 and the upper electrode 30 are provided substantially parallel to each other.

The upper electrode 30 is supported in the upper portion of the processing container 12 via an insulating shielding member 32. The upper electrode 30 includes an electrode plate 34 and an electrode support 36. The electrode plate 34 faces a processing space S1, and is provided with a plurality of gas injection holes 34a. The electrode plate 34 is configured by a low-resistance conductor or semiconductor with a small Joule heat.

The electrode support 36 detachably supports the electrode plate 34. The electrode support 36 is made of a conductive material such as, for example, aluminum. The electrode support 36 may have a water-cooled structure. A gas diffusion chamber 36a is provided inside the electrode support 36. In the electrode support 36, a plurality of gas flow holes 36b extends downward from the gas diffusion chamber 36a to communicate with the gas injection holes 34a. Further, a gas inlet port 36c is formed in the electrode support 36 to introduce a processing gas into the gas diffusion chamber 36a. A gas supply pipe 38 is connected to the gas inlet port 36c.

A gas source group 40 is connected to the gas supply pipe 38 via a valve group 42 and a flow controller group 44. The valve group 42 includes a plurality of opening/closing valves. The flow controller group 44 includes a plurality of flow controllers such as mass flow controllers. In addition, the gas source group 40 includes gas sources for plural types of gases necessary for the plasma processing. The plurality of gas sources of the gas source group 40 are connected to the gas supply pipe 38 via the corresponding opening/closing valves and the corresponding mass flow controllers, respectively.

In the plasma processing apparatus 10, one or more gases from one or more gas sources selected from the plurality of gas sources of the gas source group 40 are supplied to the gas supply pipe 38. The gas supplied to the gas supply pipe 38 reaches the gas diffusion chamber 36a, and is injected to the processing space S through the gas flow holes 36b and the gas injection holes 34a.

In addition, as illustrated in FIG. 1, the plasma processing apparatus 10 further includes a ground conductor 12a. The ground conductor 12a is a substantially cylindrical ground conductor, and is provided to extend upward from the side wall of the processing container 12 to be higher than the height position of the upper electrode 30.

In addition, in the plasma processing apparatus 10, a deposit shield 46 is detachably provided along the inner wall of the processing container 12. The deposit shield 46 is also provided on the outer periphery of the support 14. The deposit shield 46 prevents etching by-products (deposits) from adhering to the processing container 12, and is configured by coating an aluminum material with ceramics such as, for example, $Y_2O_3$.

An exhaust plate 48 is provided close to the bottom of the processing container 12 between the support 14 and the inner wall of the processing container 12. The exhaust plate 48 is configured by coating an aluminum material with ceramic such as, for example, $Y_2O_3$. The processing container 12 is provided with an exhaust port 12e below the exhaust plate 48. An exhaust device 50 is connected to the exhaust port 12e via an exhaust pipe 52. The exhaust device 50 includes a vacuum pump such as a turbo molecular pump, and is able to reduce the pressure inside the processing container 12 to a desired degree of vacuum. In addition, a carry-in/out port 12g for the wafer W is provided in the side wall of the processing container 12. The carry-in/out port 12g is openable/closable by a gate valve 54.

The operation of the plasma processing apparatus 10 configured as described above is collectively controlled by a controller 100. The controller 100 is, for example, a computer, and controls each unit of the plasma processing apparatus 10. The operation of the plasma processing apparatus 10 is collectively controlled by the controller 100.

[Configuration of Stage]

Figure 2:
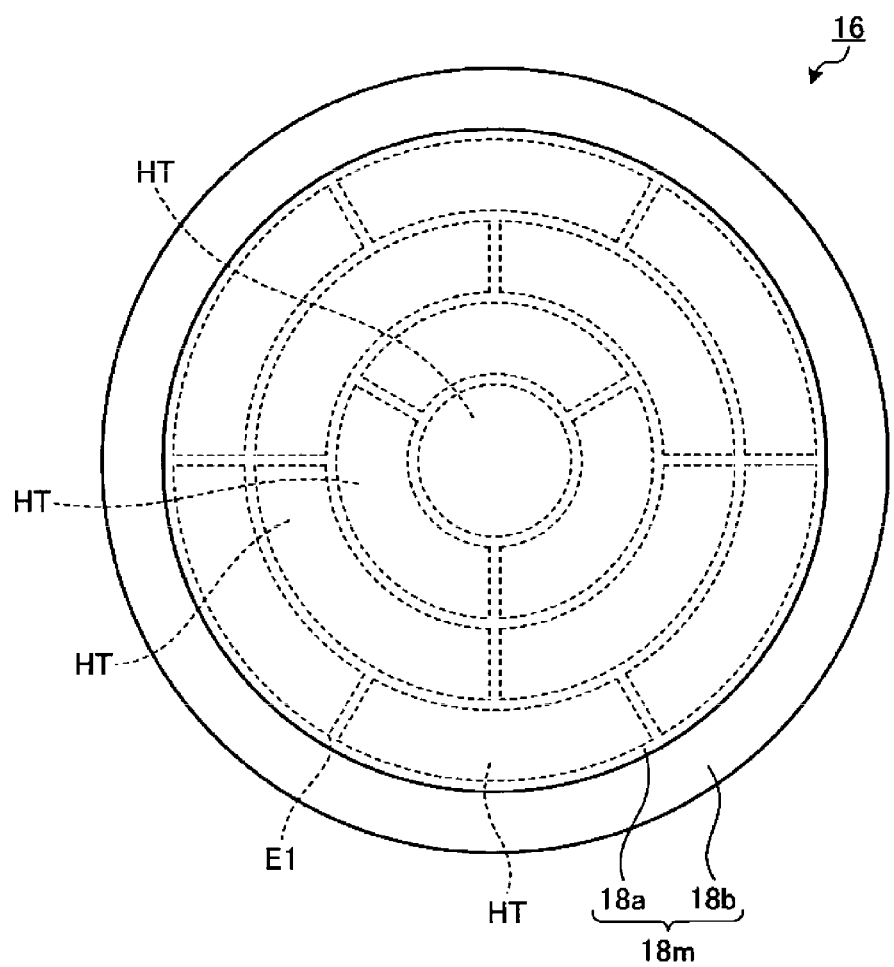
FIG. 2 is a plan view illustrating a stage according to the embodiment.

Next, the stage 16 will be described in detail. FIG. 2 is a plan view illustrating the stage according to the embodiment. As described above, the stage 16 includes the electrostatic chuck 18 and the base 20. The electrostatic chuck 18 has a main body 18m made of ceramic. The main body 18m has a substantially disk shape. The main body 18m has a placing region 18a and an outer peripheral region 18b. The placing region 18a is a substantially circular region in plan view. The wafer W is placed on the upper surface of the placing region 18a. That is, the upper surface of the placing region 18a functions as the placing surface on which the wafer W is placed. The focus ring FR is disposed on the upper surface of the outer peripheral region 18b. The diameter of the placing region 18a is substantially the same as or slightly smaller than the diameter of the wafer W. The outer peripheral region 18b surrounds the placing region 18a, and extends in a substantially annular form. In the present embodiment, the upper surface of the outer peripheral region 18b is lower in height than the upper surface of the placing region 18a.

The electrostatic chuck 18 includes the electrode E1 for the electrostatic adsorption, inside the placing region 18a. The electrode E1 is connected to the DC power supply 22 via the switch SW1 as described above.

In addition, a plurality of heaters HT is provided inside the placing region 18a and below the electrode E1. In the present embodiment, the placing region 18a is divided into a plurality of divided regions, and a heater HT is provided in each divided region. For example, as illustrated in FIG. 2, the placing region 18a is divided into a central circular region and a plurality of concentric annular regions that surrounds the circular region, and the plurality of heaters HT are provided in the divided regions, respectively. In addition, the plurality of annular regions are further divided in the circumferential direction, and the plurality of heaters HT are arranged in the circumferential direction. In addition, the way to obtain the divided regions illustrated in FIG. 2 is an example, and may not be limited thereto. The placing region 18a may be divided into a larger number of divided regions. For example, the placing region 18a may be divided into divided regions which have a smaller angular width and a narrower radial width as approaching the outer periphery. In addition, the heaters HT may be provided in the outer peripheral region 18b to control the temperature of the focus ring FR.

The heaters HT of the respective divided regions are individually connected to a heater power supply HP illustrated in FIG. 1 via wires (not illustrated) provided in the base 20. The heater power supply HP supplies an individually adjusted power to each heater HT, under the control of the controller 100. As a result, the heat generated by each heater HT is individually controlled, so that the temperatures of the plurality of divided regions in the placing region 18a are individually adjusted.

The heater power supply HP is provided with a power detector PD that detects the supply power supplied to each heater HT. In addition, the power detector PD may be provided on the wire through which the power flows from the heater power supply HP to each heater HT, separately from the heater power supply HP. The power detector PD detects the supply power supplied to each heater HT. For example, the power detector PD detects a power amount [W] as the supply power supplied to each heater HT. The heater HT generates heat according to the power amount. Thus, the amount of the power supplied to the heater HT represents a heater power. The power detector PD notifies the controller 100 of power data indicating the detected supply power that is supplied to each heater HT.

Further, the stage 16 includes a temperature sensor (not illustrated) capable of detecting the temperature of the heater HT in each divided region of the placing region 18a. The temperature sensor may be a device capable of measuring the temperature, separately from the heater HT. In addition, the temperature sensor may be disposed in the wire through which the power flows to the heater HT, and considering the fact that the electric resistance of a main metal increases in proportion to an increase of a temperature, the temperature sensor may detect the temperature from a resistance value obtained by measuring a voltage and a current applied to the heater HT. A sensor value detected by each temperature sensor is sent to a temperature measuring device TD. The temperature measuring device TD measures the temperature of each divided region of the placing region 18a from each sensor value. The temperature measuring device TD notifies the controller 100 of temperature data indicating the temperature of each divided region of the placing region 18a.

In addition, a heat transfer gas, for example, He gas may be supplied between the upper surface of the electrostatic chuck 18 and the back surface of the wafer W, by a heat transfer gas supply mechanism and a gas supply line (not illustrated).

[Configuration of Controller]

Figure 3:
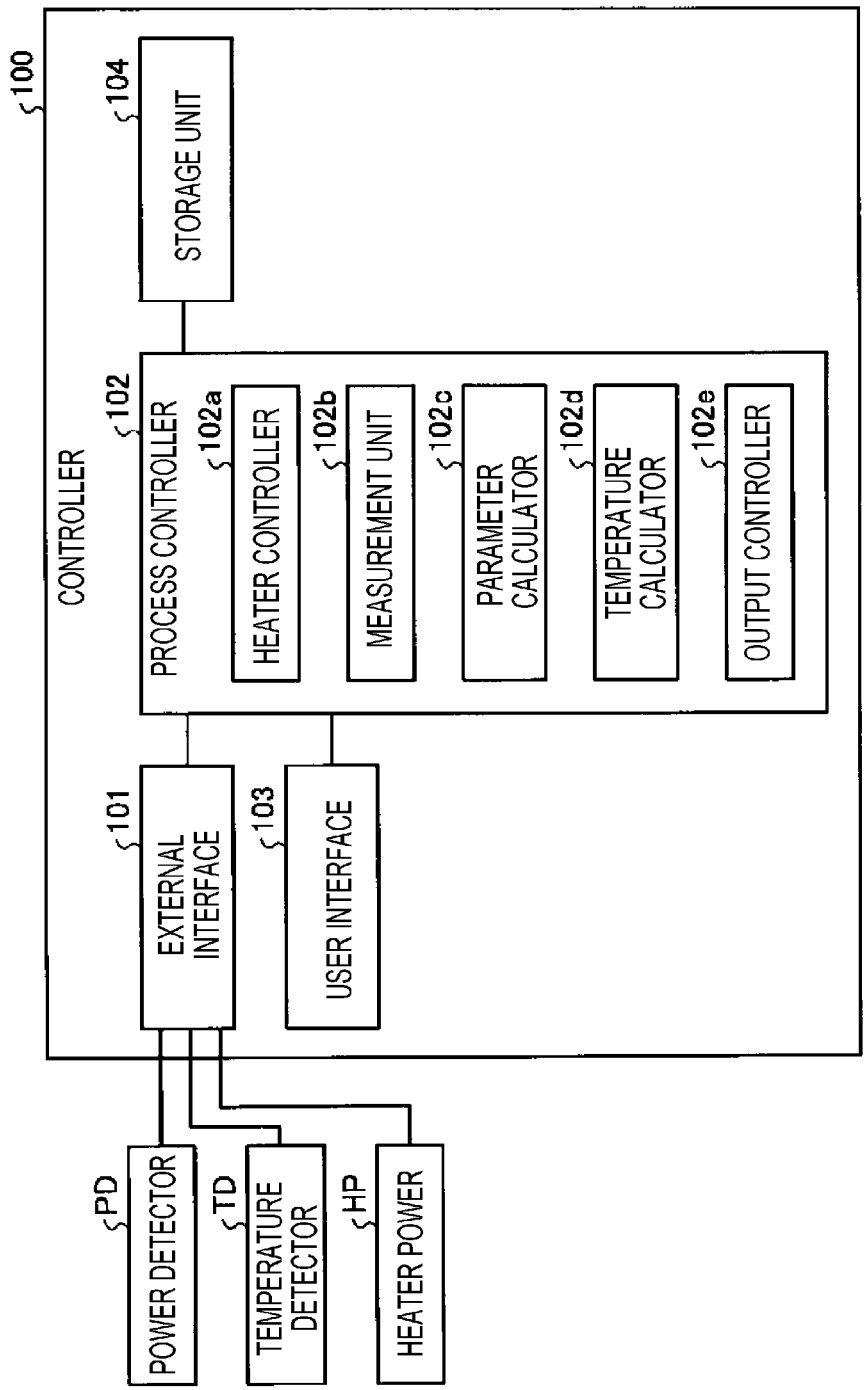
FIG. 3 is a block diagram illustrating a schematic configuration of a controller that controls the plasma processing apparatus according to the embodiment.

Next, the controller 100 will be described in detail. FIG. 3 is a block diagram illustrating a schematic configuration of the controller that controls the plasma processing apparatus according to the embodiment. The controller 100 is, for example, a computer, and includes an external interface 101, a process controller 102, a user interface 103, and a storage unit 104.

The external interface 101 is able to communicate with each unit of the plasma processing apparatus 10, so as to input/output various types of data. For example, the power data indicating the supply power supplied to each heater HT is input from the power detector PD to the external interface 101. In addition, the temperature data indicating the temperature of each divided region of the placing region 18a is input from the temperature measuring device TD to the external interface 101. In addition, the external interface 101 outputs control data for controlling the supply power supplied to each heater HT, to the heater power supply HP.

The process controller 102 includes a CPU (central processing unit) and controls each unit of the plasma processing apparatus 10.

The user interface 103 is configured by, for example, a keyboard with which a process manager performs an operation to input commands for managing the plasma processing apparatus 10, and a display for visualizing and displaying the operation status of the plasma processing apparatus 10.

The storage unit 104 stores a control program (software) for implementing various processes performed in the plasma processing apparatus 10 under the control of the process controller 102, and a recipe that stores, for example, processing condition data. Further, the storage unit 104 stores, for example, parameters relating to devices or processes for performing the plasma processing. In addition, the control program and the recipe may be stored in a computer-readable recording medium (e.g., a hard disk, an optical disk such as a DVD, a flexible disk, or a semiconductor memory). The control program and the recipe such as processing condition data may be stored in another device, and may be used online by being transmitted at any time through, for example, a dedicated line.

The process controller 102 includes an internal memory for storing programs or data, reads the control program stored in the storage unit 104, and executes the processing of the read control program. When the control program operates, the process controller 102 functions as various processors. For example, the process controller 102 has functions of a heater controller 102a, a measurement unit 102b, a parameter calculator 102c, a temperature calculator 102d, and an output controller 102e. In addition, the respective functions of the heater controller 102a, the measurement unit 102b, the parameter calculator 102c, the temperature calculator 102d, and the output controller 102e may be distributed and implemented by a plurality of controllers.

Meanwhile, in the plasma processing, the progress of the processing changes according to the temperature of the wafer W. For example, in a plasma etching, the progressing speed of the etching changes according to the temperature of the wafer W. Thus, it is conceived that each heater HT controls the temperature of the wafer W to be a target temperature, in the plasma processing apparatus 10.

However, in the plasma processing, heat is input toward the wafer W from plasma. Thus, the plasma processing apparatus 10 may be unable to accurately control the temperature of the wafer W to be the target temperature during the plasma processing.

Figure 4:
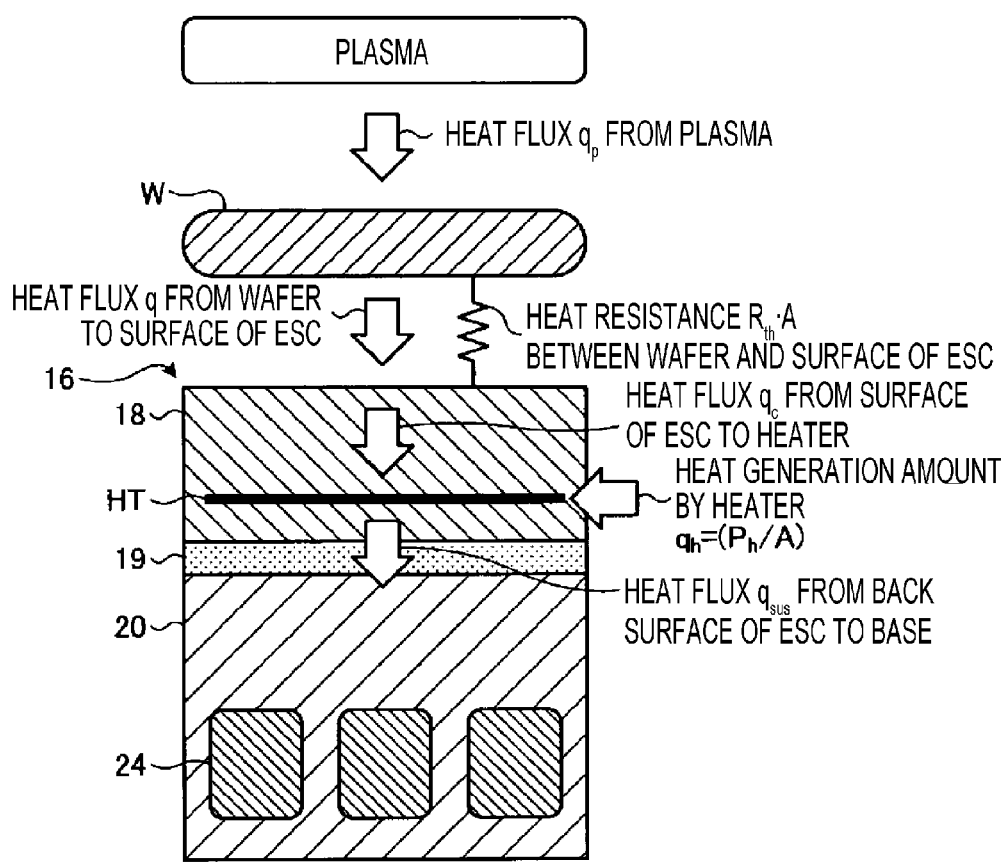
FIG. 4 is a view schematically illustrating a flow of energy near the stage according to the embodiment.

Descriptions will be made on the flow of energy that affects the temperature of the wafer W, near the stage 16. FIG. 4 is a view schematically illustrating the flow of energy near the stage 16 according to the embodiment. FIG. 4 represents the stage 16 including the wafer W and the electrostatic chuck (ESC) 18, in a simplified form. The example of FIG. 4 represents the flow of energy that affects the temperature of the wafer W, for one divided region of the placing region 18a of the electrostatic chuck 18. The stage 16 includes the electrostatic chuck 18 and the base 20. The electrostatic chuck 18 and the base 20 are adhered to each other by an adhesive layer 19. The heater HT is provided inside the placing region 18a of the electrostatic chuck 18. The coolant flow path 24 through which a coolant flows is formed inside the base 20.

The heater HT generates heat according to the supply power supplied from the heater power supply HP, so that the temperature of the heater HT increases. In FIG. 4, the supply power supplied to the heater HT is represented as a heater power $P_h$. Further, in the heater HT, a heat generation amount (heat flux) $q_h$ per unit area is generated, and obtained by dividing the heater power $P_h$ by the area A of the divided region of the electrostatic chuck 18 where the heater HT 18 is provided.

Further, when the plasma processing is being performed, the temperature of the wafer W increases due to the heat input from plasma. FIG. 4 represents a heat flux $q_p$ from the plasma per unit area which is obtained by dividing a heat input amount from the plasma to the wafer W by the area of the wafer W.

It is known that the heat input from the plasma is proportional to the product of an amount of ions in the plasma mainly irradiated to the wafer W and a bias potential for drawing the ions of the plasma into the wafer W. The amount of ions in the plasma irradiated to the wafer W is proportional to the electron density of the plasma. The electron density of the plasma is proportional to the radio-frequency power applied for generating plasma from the first radio-frequency power supply HFS. Further, the electron density of the plasma relies on the pressure in the processing container 12. The bias potential for drawing ions in the plasma into the wafer W is proportional to the radio-frequency bias power applied for generating a bias potential from the second radio-frequency power supply LFS. Further, the bias potential for drawing ions of the plasma into the wafer W relies on the pressure in the processing container 12. In addition, when the radio-frequency power LFS is not applied to the stage 16, ions are drawn into the stage 16 due to a difference between the plasma potential generated when the plasma is generated and the potential of the stage 16.

In addition, the heat input from the plasma includes, for example, a heating by a light emission of the plasma, irradiation to the wafer W with electrons or radicals in the plasma, and a surface reaction on the wafer W with ions and radicals. These components also rely on the radio-frequency power for generating plasma, the radio-frequency bias power, and the pressure. The heat input from the plasma relies on other device parameters relating to the generation of plasma, for example, the distance between the stage 16 and the upper electrode 30 and a type of gas supplied to the processing space S.

The heat transferred to the wafer W is transferred to the electrostatic chuck 18. Here, the heat of the wafer W is not entirely transferred to the electrostatic chuck 18, but is transferred to the electrostatic chuck 18 according to a difficulty in heat transfer, such as the degree of contact between the wafer W and the electrostatic chuck 18. The difficulty in heat transfer, that is, the heat resistance is inversely proportional to the cross-sectional area with respect to the transfer direction of the heat. Thus, in FIG. 4, the difficulty in heat transfer from the wafer W to the surface of the electrostatic chuck 18 is represented as a heat resistance $R_{th} \cdot A$ per unit area between the wafer W and the surface of the electrostatic chuck 18. In addition, the symbol "A" refers to the area of the divided region where the heater HT is provided. The symbol "$R_{th}$" refers to the heat resistance in the entire divided region where the heater HT is provided. Further, in FIG. 4, the heat input amount from the wafer W to the surface of the electrostatic chuck 18 is represented as a heat flux q per unit area from the wafer W to the surface of the electrostatic chuck 18. In addition, the heat resistance $R_{th} \cdot A$ relies on the surface state of the electrostatic chuck 18, the value of the DC voltage applied from the DC power supply 22 for holding the wafer W, and the pressure of the heat transfer gas supplied between the upper surface of the electrostatic chuck 18 and the back surface of the wafer W. Further, the heat resistance $R_{th} \cdot A$ also relies on other device parameters relating to the heat resistance or the heat conductivity.

The heat transferred to the surface of the electrostatic chuck 18 increases the temperature of the electrostatic chuck 18, and is transferred to the heater HT. In FIG. 4, the heat input amount from the surface of the electrostatic chuck 18 to the heater HT is represented as a heat flux $q_c$ per unit area from the surface of the electrostatic chuck 18 to the heater HT.

Meanwhile, the base 20 is cooled by the coolant that flows through the coolant flow path 24, and cools the electrostatic chuck 18 in contact with the base 20. At this time, in FIG. 4, a heat release amount from the back surface of the electrostatic chuck 18 to the base 20 via the adhesive layer 19 is represented as a heat flux $q_{sus}$ per unit area from the back surface of the electrostatic chuck 18 to the base 20. As a result, the heater HT is cooled by the release of heat, and the temperature of the heater HT decreases.

In a case where the temperature of the heater HT is controlled to be constant, the heater HT enters into a state where the sum of the heat input amount of the heat transferred to the heater HT and the heat generation amount of the heater HT is equal to the heat release amount from the heater HT.

Accordingly, when the temperature of the heater HT is controlled to be constant, the supply power supplied to the heater HT varies according to the heat amount transferred from the electrostatic chuck 18.

Figure 5A:
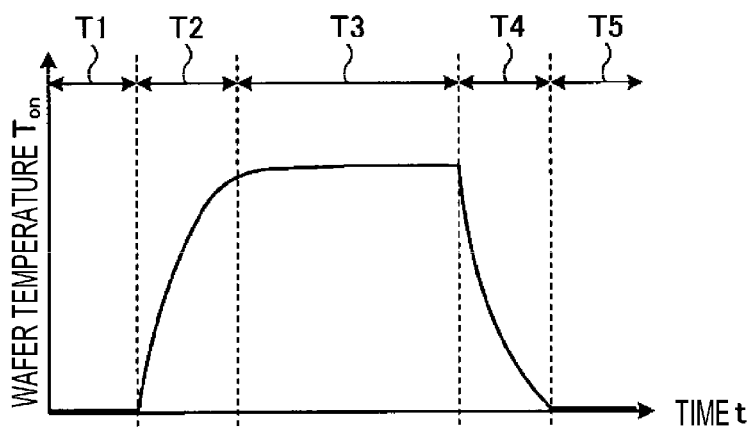
FIGS. 5A and 5B are views illustrating examples of variations in temperature of a wafer and supply power supplied to a heater.
Figure 5B:
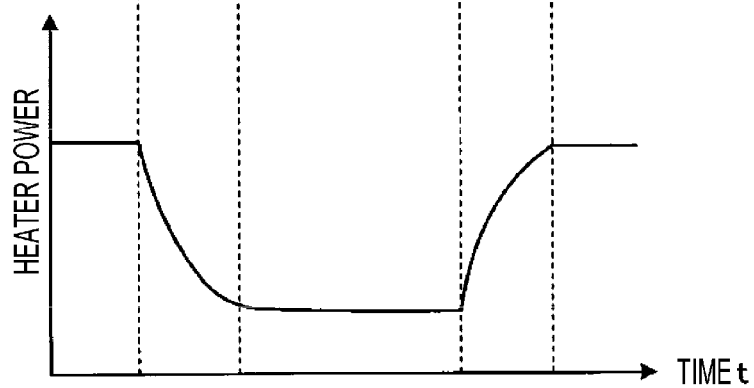

FIGS. 5A and 5B are views illustrating examples of variations in temperature of the wafer W and supply power supplied to the heater HT. FIG. 5A represents the variation in temperature of the wafer W. FIG. 5A represents the variation in supply power supplied to the heater HT. FIGS. 5A and 5B represent examples of results obtained by measuring the temperature of the wafer W and the supply power supplied to the heater HT, while the temperature of the heater HT is controlled to be constant, and the state of plasma shifts from a state where plasma is not ignited to a state where plasma is ignited, and then, further shifts to a state where plasma is extinguished. The temperature of the wafer W was measured using a wafer for a temperature measurement such as Etch Temp available from the KLA-Tencor corporation. The wafer for the temperature measurement is expensive. Thus, when the wafer for the temperature measurement is used to adjust the temperature of each heater HT of the plasma processing apparatus 10 in a mass production field, costs increase. Further, when the wafer for the temperature measurement is used to adjust the temperature of each heater HT of the plasma processing apparatus 10 in a mass production field, the productivity is reduced.

In FIGS. 5A and 5B, a period T1 corresponds to a non-ignited state where plasma is not ignited. In the period T1, the supply power supplied to the heater HT is constantly stable. In FIGS. 5A and 5B, periods T2 and T3 correspond to an ignited state where plasma is ignited. The ignited state includes a transient state where the temperature of the wafer W has an increasing tendency as represented in the period T2, and a steady state where the temperature of the wafer W is constantly stable as represented in the period T3. In the period T2, the supply power supplied to the heater HT decreases. Further, in the period T2, the temperature of the wafer W increases to a specific temperature. In the period T3, the temperature of the wafer W enters into a constantly stable state, and the supply power supplied to the heater HT also becomes substantially constantly stable.

In FIGS. 5A and 5B, periods T4 and T5 correspond to a non-ignited state where plasma is extinguished. The non-ignited state subsequent to the ignited state includes a transient state where the temperature of the wafer W has a decreasing tendency as represented in the period T4, and a steady state where the temperature of the wafer W is constantly stable as represented in the period T5. In the period T4, the supply power supplied to the heater HT increases. Further, in the period T4, the temperature of the wafer W decreases to a specific temperature. In the period T5, the temperature of the wafer W enters into a constantly stable state, and the supply power supplied to the heater HT also becomes substantially constantly stable.

In the present embodiment, the steady state where the supply power supplied to the heater HT becomes stable in the ignited state of plasma as represented in the period T3 corresponds to a first steady state. In addition, the steady state where the supply power supplied to the heater HT becomes stable in the extinguished state of plasma as represented in the period T1 or T5 corresponds to a second steady state.

Figure 6A:
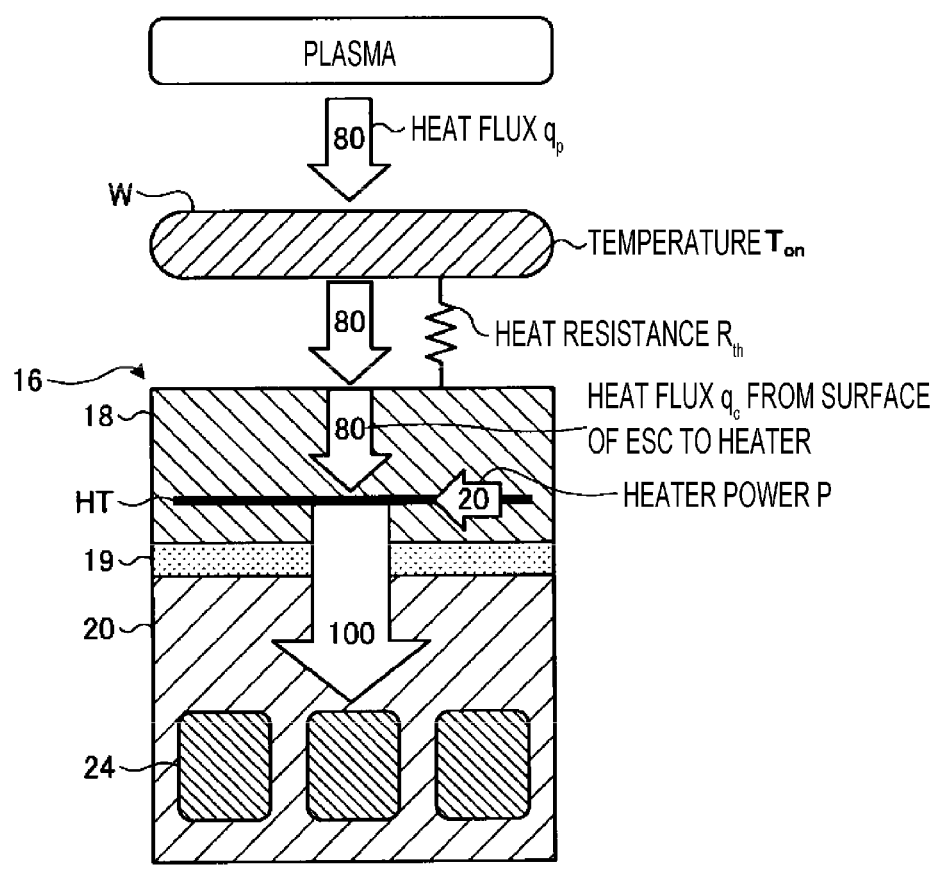
FIG. 6A is a view schematically illustrating a flow of energy near the stage in a period T3 of FIGS. 5A and 5B according to the embodiment.

Here, the flow of energy near the stage 16 in the periods T3 to T5 will be described. FIG. 6A is a view schematically illustrating the flow of energy near the stage 16 in the period T3. In the example of FIG. 6A, a heat amount of "100" is released from the heater HT due to the cooling from the base 20. In the period T3, since plasma is ignited, the heat of the plasma is input to the wafer W. In the example of FIG. 6A, a heat amount of "80" is transferred from the plasma to the wafer W. The heat transferred to the wafer W is transferred to the electrostatic chuck 18. In addition, when the temperature of the wafer W enters into the steady state where the temperature of the wafer W is constantly stable as represented in the period T3, the wafer W enters into a state where a heat input amount and a heat output amount are equal to each other. Thus, the heat amount of "80" transferred from the plasma to the wafer W is transferred from the wafer W to the surface of the electrostatic chuck 18. The heat transferred to the surface of the electrostatic chuck 18 is transferred to the heater HT. When the temperature of the electrostatic chuck 18 is in the steady state, the electrostatic chuck 18 enters into a state where a heat input amount and a heat output amount are equal to each other. Thus, the heat amount of "80" transferred to the surface of the electrostatic chuck 18 is transferred to the heater HT. When the temperature of the heater HT is controlled to be constant, the heater HT enters into a state where the sum of the heat input amount of the heat transferred to the heater HT and the heat generation amount of the heater HT is equal to the heat release amount of the heat released from the heater HT. Thus, when the temperature of the heater HT is controlled to be constant, a heat amount of "20" is supplied to the heater HT as the heater power $P_h$ from the heater power supply HP.

Figure 6B:
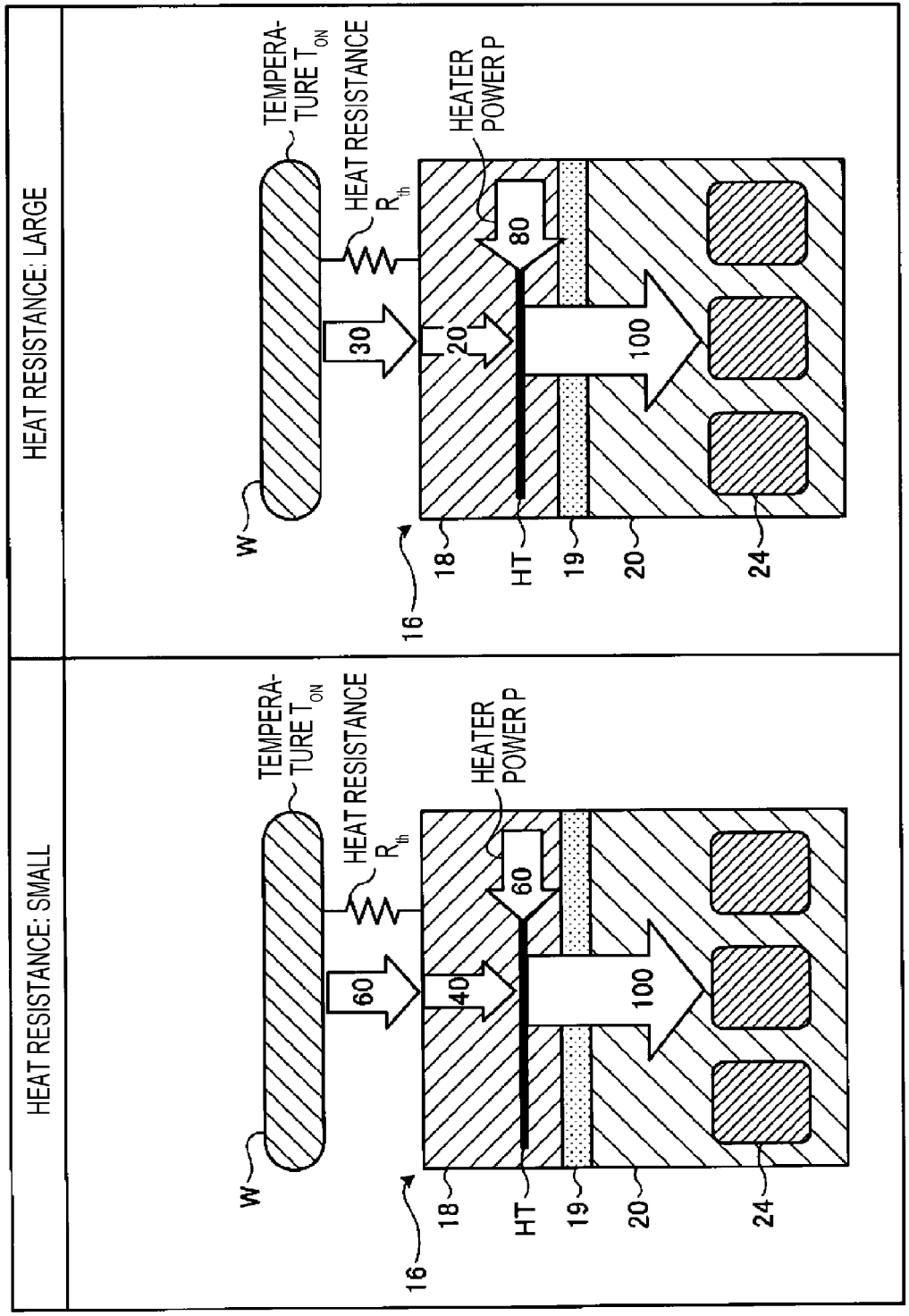
FIG. 6B is a view schematically illustrating a flow of energy near the stage in a period T4 of FIGS. 5A and 5B according to the embodiment.

FIG. 6B is a view schematically illustrating the flow of energy near the stage 16 in the period T4 of FIGS. 5A and 5B. In addition, in the transient state, the flow of energy varies due to the heat resistance between the wafer W and the surface of the electrostatic chuck 18. FIG. 6B separately represents a case where the heat resistance is small and a case where the heat resistance is large. In the transient state, the flow of energy varies due to the heat resistance between the wafer W and the electrostatic chuck 18. In the example of FIG. 6B as well, the heat amount of "100" is released from the heater HT due to the cooling from the base 20. In the period T4, the plasma is extinguished, and thus, no heat is input from the plasma to the wafer W.

For example, in the example "Heat Resistance: Small" of FIG. 6B, a heat amount of "60" is transferred from the wafer W to the surface of the electrostatic chuck 18. Then, of the heat amount of "60" transferred to the surface of the electrostatic chuck 18, a heat amount of "40" is transferred to the heater HT. When the temperature of the heater HT is controlled to be constant, a heat amount of "60" is supplied to the heater HT as the heater power $P_h$ from the heat power supply HP.

Meanwhile, in the example "Heat Resistance: Large" of FIG. 6B, a heat amount of "30" is transferred from the wafer W to the surface of the electrostatic chuck 18. Then, of the heat amount "30" transferred to the surface of the electrostatic chuck 18, a heat amount of "20" is transferred to the heater HT. When the temperature of the heater HT is controlled to be constant, a heat amount of "80" is supplied to the heater HT as the heater power $P_h$ from the heater power supply HP.

Figure 6C:
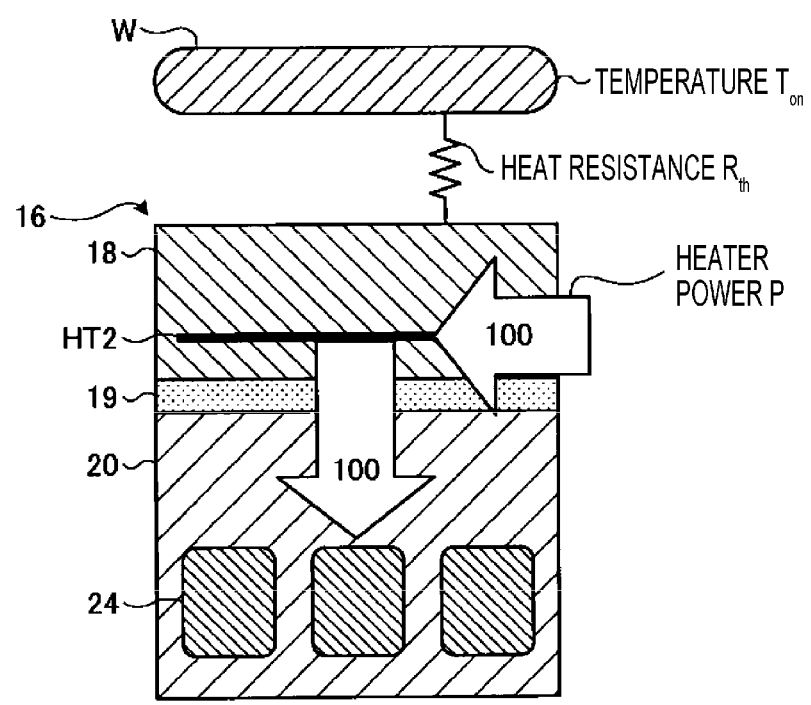
FIG. 6C is a view schematically illustrating a flow of energy near the stage in a period T5 of FIGS. 5A and 5B according to the embodiment.

FIG. 6C is a view schematically illustrating the flow of energy near the stage 16 in the period T5. In addition, the flow of energy near the stage 16 in the period T1 of FIGS. 5A and 5B is the same as that in the period T5. In the example of FIG. 6C as well, a heat amount of "100" is released from the heater HT due to the cooling from the base 20. When the temperature of the heater HT is controlled to be constant, a heat amount of "100" is supplied to the heater HT as the heater power $P_h$ from the heater power supply HP.

As represented in FIG. 6B, when the temperature of the heater HT is controlled to be constant, the heater power $P_h$ varies according to the heat input amount from the plasma to the wafer W or the heat resistance between the wafer W and the surface of the electrostatic chuck 18. Accordingly, a decreasing tendency of the supply power supplied to the heater HT in the period T4 varies according to, for example, the heat input amount from plasma to the wafer W when plasma is ignited or the heat resistance between the wafer W and the surface of the electrostatic chuck 18.

In addition, as represented in FIGS. 6A to 6C, when the temperature of the heater HT is controlled to be constant, the heat amount of "100" is released from the heater HT due to the cooling from the base 20 in any of the states "T3: Plasma-Ignited State," "T4: Transient State," and "T5: Steady State." That is, the heat flux $q_{sus}$ per unit area from the heater HT toward the coolant supplied to the coolant flow path 24 formed inside the base 20 is always constant, and the temperature gradient from the heater HT to the coolant is also always constant. Thus, the temperature sensor used for controlling the temperature of the heater HT to be constant may not necessarily be attached directly to the heater HT. For example, as long as the temperature sensor is disposed between the heater HT and the coolant, for example, at any position on the back surface of the electrostatic chuck 18 or inside the adhesive layer 19 or the base 20, the temperature difference between the heater HT and the temperature sensor is always constant. Then, by calculating a temperature difference ΔT between the temperature sensor and the heater HT using, for example, the heat conductivity and the heat resistance of a material between the heater HT and the temperature sensor, and adding the temperature difference ΔT to a temperature value detected by the temperature sensor, the obtained value may be output as the temperature of the heater HT, and the actual temperature of the heater HT may be controlled to be constant.

Figure 7:
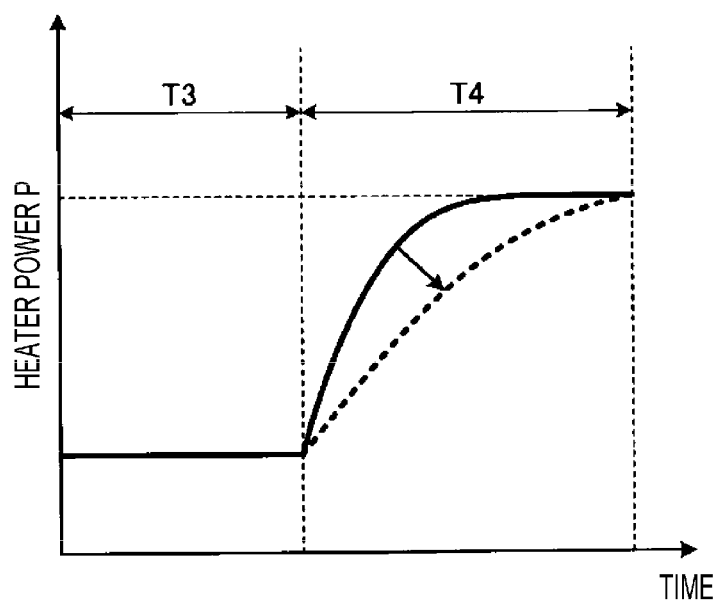
FIG. 7 is a view illustrating an example of a variation in supply power supplied to the heater in the period T4 according to a variation in heat resistance between a wafer and the surface of an electrostatic chuck.

FIG. 7 is a view illustrating an example of the variation in supply power supplied to the heater HT in the period T4 according to the variation in heat resistance between the wafer W and the surface of the electrostatic chuck 18. For example, while the amount of the supply power supplied to the heater HT in the period T4 varies as represented by the solid line when the heat resistance between the wafer W and the surface of the electrostatic chuck 18 is small, the variation becomes gentle as represented by the dashed line when the heat resistance between the wafer W and the surface of the electrostatic chuck 18 is large.

Thus, the graph of the supply power supplied to the heater HT in the period T4 may be modeled, using the heat input amount from the plasma to the wafer W and the heat resistance between the wafer W and the surface of the electrostatic chuck 18, as parameters. That is, the variation in supply power supplied to the heater HT in the period T4 may be modeled by an arithmetic expression using the heat input amount from the plasma to the wafer W and the heat resistance between the wafer W and the surface of the electrostatic chuck 18, as parameters.

In the present embodiment, the variation in supply power supplied to the heater HT in the period T4 of FIGS. 5A and 5B is modeled by an expression per unit area. For example, an elapsed time after plasma is extinguished is defined as "t," the heater power $P_h$ in the elapsed time "t" is defined as $P_{h(t)}$, and the heat generation amount $q_h$ from the heater HT per unit area in the elapsed time "t" is defined as $q_{h(t)}$. In this case, the heat generation amount $q_{h(t)}$ from the heater HT per unit area in the elapsed time "t" may be expressed by an equation (2) below. Further, the heat generation amount $q_{h\_off}$ from the heater HT per unit area in the steady state when plasma is extinguished may be expressed by an equation (3) below. Further, the heat resistance $R_{thc} \cdot A$ per unit area between the surface of the electrostatic chuck 18 and the heater HT may be expressed by an equation (4) below. The heat flux $q_p$ varies according to the case where plasma is ignited and the case where plasma is not ignited. The heat flux $q_p$ per unit area from plasma to the wafer W when plasma is ignited is defined as a heat flux $q_{p\_on}$. By using, as parameters, the heat flux $q_{p\_on}$ per unit area from plasma to the wafer W and the heat resistance $R_{th} \cdot A$ per unit area between the wafer W and the surface of the electrostatic chuck 18, $a_1$, $a_2$, $a_3$, $\lambda_1$, $\lambda_2$, $\tau_1$, and $\tau_2$ are expressed as equations (5) to (11) below. In this case, the heat generation amount $q_{h(t)}$ from the heater HT per unit area when there exists a heat flux from plasma may be expressed as an equation (1) below.

$$q_{h(t)} = q_{h\_off} + \frac{R_{th} \cdot A \cdot q_{P\_on}}{R_{thc} \cdot A \cdot (\lambda_1 - \lambda_2)} \left\{ \left(1 + \frac{a_2 + a_3}{a_1 \cdot a_3} \cdot \lambda_2\right)(2a_1 + 3\lambda_1)\exp\left(-\frac{t}{\tau_1}\right) - \left(1 + \frac{a_2 + a_3}{a_1 \cdot a_3} \cdot \lambda_1\right)(2a_1 + 3\lambda_2)\exp\left(-\frac{1}{\tau_2}\right) \right\} \quad (1)$$

$$q_{h(t)} = P_{h(t)} / A \quad (2)$$

$$q_{h\_off} = P_{h\_off} / A \quad (3)$$

$$R_{thc} \cdot A = \frac{z_c}{\kappa_c} \quad (4)$$

$$a_1 = \frac{1}{\rho_w \cdot C_w \cdot z_w \cdot R_{th} \cdot A} \quad (5)$$

$$a_2 = \frac{2}{\rho_c \cdot C_c \cdot z_c \cdot R_{th} \cdot A} \quad (6)$$

$$a_3 = \frac{2}{\rho_c \cdot C_c \cdot z_c \cdot R_{thc} \cdot A} \quad (7)$$

$$\lambda_1 = \frac{1}{2}\left\{-(a_1 + 2a_2 + 2a_3) + \sqrt{(a_1 + 2a_2 + 2a_3)^2 - 8a_1 a_3}\right\} \quad (8)$$

$$\lambda_2 = \frac{1}{2}\left\{-(a_1 + 2a_2 + 2a_3) - \sqrt{(a_1 + 2a_2 + 2a_3)^2 - 8a_1 a_3}\right\} \quad (9)$$

$$\tau_1 = -\frac{1}{\lambda_1} \quad (10)$$

$$\tau_2 = -\frac{1}{\lambda_2} \quad (11)$$

Here, the symbol "$P_{h(t)}$" refers to a heater power [W] in the elapsed time "t."

The symbol "$P_{h\_off}$" refers to a heater power [W/m²] in the steady state when plasma is extinguished (the steady state when there is no heat flux from plasma).

The symbol "$q_{h(t)}$" refers to a heat generation amount [W/m²] from the heater HT per unit area in the elapsed time "t."

The symbol "$q_{h\_off}$" refers to a heat generation amount [W/m²] from the heater HT per unit area in the steady state when plasma is extinguished.

The symbol "$R_{th} \cdot A$" refers to a heat resistance [K·m²/W] per unit area from plasma to the wafer W.

The symbol "$R_{thc} \cdot A$" refers to a heat resistance [K·m²/W] per unit area between the surface of the electrostatic chuck 18 and the heater HT.

The symbol "A" refers to an area [m²] of the region where the heater HT is provided.

The symbol "$\rho_w$" refers to a density [kg/m²] of the wafer W.

The symbol "$C_w$" refers to a heat capacity of the wafer W [J/K·m²] per unit area.

The symbol "$z_w$" refers to a thickness [m] of the wafer W.

The symbol "$\rho_c$" refers to a density [kg/m²] of the ceramic making up the electrostatic chuck 18.

The symbol "$C_c$" refers to a heat capacity [J/K·m²] of the ceramic making up the electrostatic chuck 18 per unit area.

The symbol "$z_c$" refers to a distance [m] from the surface of the electrostatic chuck 18 to the heater HT.

The symbol "$\eta_c$" refers to a heat conductivity [W/K·m] of the ceramic making up the electrostatic chuck 18.

The symbol "t" refers to an elapsed time [sec] after plasma is extinguished.

As for the symbol "$a_1$" represented in the equation (5), $1/a_1$ is a time constant indicating a difficulty in that the wafer W is warmed. In addition, as for the symbol "$a_2$" represented in the equation (6), $1/a_2$ is a time constant indicating a difficulty in that the heat enters the electrostatic chuck 18, that is, a difficulty in that the electrostatic chuck 18 is warmed. Further, as for the symbol "$a_3$" represented in the equation (7), $1/a_3$ is a time constant indicating a difficulty in that the heat penetrates the electrostatic chuck 18, that is, a difficulty in that the electrostatic chuck 18 is warmed.

The density $\rho_w$ of the wafer W, the heat capacity $C_w$ of the wafer W per unit area, and the thickness $z_w$ of the wafer W are determined in advance from the actual configuration of the wafer W. The area A of the heater HT and the distance $z_c$ from the surface of the electrostatic chuck 18 to the heater HT are determined in advance from the actual configuration of the plasma processing apparatus 10. The density $\rho_c$ of the ceramic making up the electrostatic chuck 18, the heat capacity $C_c$ of the ceramic making up the electrostatic chuck 18 per unit area, and the heat conductivity $\kappa_c$ of the ceramic making up the electrostatic chuck 18 are also determined in advance from the actual configuration of the plasma processing apparatus 10. The $R_{thc} \cdot A$ is determined in advance from the heat conductivity $\kappa_c$ and the distance $z_c$ according to the equation (4).

The heater power $P_{h(t)}$ for each elapsed time "t" after plasma is extinguished and the heater power $P_{h\_off}$ in the steady state when plasma is extinguished may be obtained through a measurement using the plasma processing apparatus 10. For example, the heater power $P_{h\_off}$ in the steady state when plasma is extinguished may be obtained by measuring the heater power $P_h$ in the period T1 or T5 of FIGS. 5A and 5B. Then, as represented in the equation (2) above, by dividing the obtained heater power $P_{h(t)}$ by the area A of the heater HT, the heat generation amount $q_{h(t)}$ from the heater HT per unit area in the elapsed time "t" may be obtained. Further, as represented in the equation (3) above, by dividing the obtained heater power $P_{h\_off}$ by the area A of the heater HT, the heat generation amount $q_{h\_off}$ from the heater HT per unit area in the steady state when plasma is extinguished may be obtained.

Then, the heat flux $q_{p\_on}$ per unit area from plasma to the wafer W and the heat resistance $R_{th} \cdot A$ per unit area between the wafer W and the surface of the electrostatic chuck 18 may be obtained by performing a fitting of the equation (1) using the measurement results.

In addition, the graph of the temperature of the wafer W in the period T4 of FIGS. 5A and 5B may also be modeled, using the heat input amount from plasma to the wafer W and the heat resistance between the wafer W and the surface of the electrostatic chuck 18, as parameters. In the present embodiment, the variation in temperature of the wafer W in the period T2 is modeled by an expression per unit area. For example, when $a_1$, $a_2$, $a_3$, $\lambda_1$, $\mu_2$, $\tau_1$, and $\tau_2$ represented in the equations (5) to (11) are used with the heat flux $q_{p\_on}$ and the heat resistance $R_{th} \cdot A$ as parameters, the temperature of the wafer W $T_{W(t)}$ [° C.] in the elapsed time "t" may be expressed by an equation (12) below.

$$T_{W(t)} = T_h - \frac{q_{p\_on}}{\rho_w \cdot C_w \cdot z_w \cdot (\lambda_1 - \lambda_2)} \quad (12)$$

$$\left\{ \left(1 + \frac{a_2 + a_3}{a_1 \cdot a_3} \cdot \lambda_2\right) \exp\left(-\frac{t}{\tau_1}\right) - \left(1 + \frac{a_2 + a_3}{a_1 \cdot a_3} \cdot \lambda_1\right) \exp\left(-\frac{t}{\tau_2}\right) \right\}$$

Here, the symbol "$T_{W(t)}$" refers to the temperature [° C.] of the wafer W in the elapsed time "t."

The symbol "$T_h$" refers to the temperature [° C.] of the heater HT controlled to be constant.

The temperature $T_h$ of the heater HT may be obtained from the condition when the temperature of the wafer W is actually controlled to be constant.

When the heat flux $q_{p\_on}$ and the heat resistance $R_{th} \cdot A$ are obtained by performing a fitting of the equation (1) using the measurement results, the temperature $T_W$ of the wafer W may be calculated from the equation (12).

Descriptions will be made referring back to FIG. 3. The heater controller 102a controls the temperature of each heater HT. For example, the heater controller 102a controls the temperature of each heater HT, by outputting control data for instructing the supply power supplied to each heater HT, to the heater power supply HP, and by controlling the supply power supplied from the heater power supply HP to each heater HT.

In the plasma processing, a target set temperature of each heater HT is set in the heater controller 102a. For example, in the heater controller 102a, the target temperature of the wafer W is set as the set temperature of the heater HT in each divided region of the placing region 18a. The target temperature of the wafer W is, for example, a temperature at which the accuracy of the plasma etching on the wafer W becomes the most satisfactory.

In the plasma processing, the heater controller 102a controls the supply power supplied to each heater HT such that the heater HT reaches the set temperature. For example, the heater controller 102a compares the temperature of each divided region of the placing region 18a which is indicated by the temperature data input to the external interface 101, with the set temperature of the divided region. Then, from the comparison result, the heater controller 102a specifies each of a divided region having a lower temperature than the set temperature and a divided region having a higher temperature than the set temperature. The heater controller 102a outputs control data for increasing the supply power supplied to the divided region having a lower temperature than the set temperature, and for decreasing the supply power supplied to the divided region having a higher temperature than the set temperature, to the heater power supply HP.

The measurement unit 102b measures the supply power supplied to each heater HT, using the supply power supplied to each heater HT which is indicated by the power data input to the external interface 101. For example, while the heater controller 102a controls the supply power supplied to each heater HT to make the temperature of the heater HT constant, the measurement unit 102b measures the supply power supplied to each heater HT in the transient state before the variation of the increasing tendency of the supply power supplied to each heater HT becomes stable after the shifting to the state where plasma is extinguished, from the steady state where the supply power supplied to each heater HT becomes stable in the ignited state of plasma. Further, while the heater controller 102a controls the supply power supplied to each heater HT to make the temperature of each heater HT constant, the measurement unit 102b measures the supply power supplied to each heater HT in the steady state where the supply power supplied to each heater HT becomes stable in the extinguished state of plasma.

For example, while the heater controller 102a controls the supply power supplied to each heater HT such that the temperature of each heater HT reaches the constant set temperature, the measurement unit 102b measures the supply power supplied to the heater HT in the transient state when plasma is extinguished as represented in the period T4 of FIGS. 5A and 5B. Further, while the heater controller 102a controls the supply power supplied to each heater HT such that the temperature of each heater HT reaches the constant set temperature, the measurement unit 102b measures the supply power supplied to each heater HT in the steady state when plasma is extinguished as represented in the period T5 of FIGS. 5A and 5B. The supply power supplied to each heater HT in the transient state when plasma is extinguished may be measured twice or more. The measurement timing for measuring the supply power supplied to each heater HT is preferably a timing at which the increasing tendency of the supply power is significant. In addition, when the number of times of the measurement is small, the measurement timing preferably has a time interval which is equal to or longer than a predetermined period. In the present embodiment, the measurement unit 102b measures the supply power supplied to each heater HT in a predetermined cycle (e.g., a cycle of 0.1 second) after plasma is ignited. As a result, the supply power supplied to each heater HT in the transient state is measured a large number of times. The supply power supplied to each heater HT in the steady state may be measured at least once for each heater HT, or may be measured a plurality of times such that an average value is determined to be the supply power in the steady state. In addition, the measurement unit 102b may measure the supply power supplied to each heater HT in the steady state represented in the period T1, instead of the period T5.

The parameter calculator 102c calculates the heat input amount and the heat resistance for each heater HT, by performing a fitting using the supply powers in the transient state and the steady state measured by the measurement unit 102b, with respect to calculation models that calculate the supply power in the transient state represented in the period T4 of FIGS. 5A and 5B using the heat input amount from plasma and the heat resistance between the wafer W and the heater HT, as parameters.

For example, the parameter calculator 102c obtains the heater power $P_{h\_off}$ in the steady state when plasma is extinguished, for each heater HT. Then, the parameter calculator 102c divides the obtained heater power $P_{h\_off}$ by the area of each heater HT, to obtain the heat generation amount $q_{h\_off}$ from the heater HT per unit area in the steady state when plasma is extinguished. Further, the parameter calculator 102c obtains the heater power $P_{h(t)}$ of the transient state in each elapsed time "t," for each heater HT. The parameter calculator 102c divides the obtained heater power $P_{h(t)}$ by the area of each heater HT, to obtain the heat generation amount $q_{h(t)}$ from the heater HT per unit area in the transient state for each elapsed time "t."

The parameter calculator 102c performs a fitting of the heat generation amount $q_{h(t)}$ and the heat generation amount $q_{h\_off}$ in each elapsed time "t" for each heater HT, using the equations (1) to (11) above as calculation models, so as to calculate the heat flux $q_{p\_on}$ and the heat resistance $R_{th} \cdot A$ at which an error is the smallest.

The parameter calculator 102c calculates the heat flux $q_{p\_on}$ and the heat resistance $R_{th} \cdot A$ using the measured supply powers in the transient state and the steady state, in a predetermined cycle. For example, each time the wafer W is replaced, the parameter calculator 102c calculates the heat flux $q_{p\_on}$ and the heat resistance $R_{th} \cdot A$, using the supply powers in the transient state and the steady state measured in a state where the wafer W is placed on the stage 16. In addition, for example, the parameter calculator 102c may calculate the heat flux $q_{p\_on}$ and the heat resistance $R_{th} \cdot A$ using the supply powers in the transient state and the steady state, for each plasma processing.

The temperature calculator 102d calculates the temperature for each heater HT, using the calculated heat input amount and heat resistance. For example, the temperature calculator 102d calculates the temperature of the wafer W in the steady state when plasma is ignited as represented in the period T3 of FIGS. 5A and 5B. For example, the temperature calculator 102d substitutes the calculated heat flux $q_p$ and heat resistance $R_{th} \cdot A$ into the equations (5), (6), and (12), for each heater HT. Then, the temperature calculator 102d calculates the temperature of the wafer W immediately after plasma is extinguished, assuming that the elapsed time "t"=0, from the equation 12 using $a_1$, $a_2$, $a_3$, $\lambda_1$, $\lambda_2$, $\tau_1$, and $\tau_2$ represented in the equations (5) to (11), for each heater HT. The assumption that the elapsed time "t"=0 refers to the timing when plasma is extinguished. Thus, the calculated temperature of the wafer W may be regarded as the temperature of the wafer W in the steady state when plasma is ignited. In addition, the calculated temperature of the wafer W may be regarded as the temperature of the wafer W during the plasma processing.

The output controller 102e controls an output of various types of information. The output controller 102e performs a control to output the temperature of the wafer W calculated by the temperature calculator 102d. For example, the output controller 102e outputs the temperature of the wafer W calculated by the temperature calculator 102d to the user interface 103, as the temperature of the wafer W when the plasma processing is performed on the wafer W. For example, each time the wafer W is replaced, the output controller 102e outputs the temperature of the wafer W when the plasma processing is performed on the wafer W, to the user interface 103. In addition, the output controller 102e may output information indicating the temperature of the wafer W as data to an external device.

As a result, the process manager is able to grasp whether the plasma processing has been performed on the wafer W at an appropriate temperature.

For each heater HT, the temperature calculator 102d calculates a set temperature of the heater HT at which the wafer W reaches the target temperature in the steady state when plasma is ignited, using the calculated heat input amount and heat resistance. For example, the temperature calculator 102d calculates the temperature $T_h$ of the heater HT when $T_{W(t)}$ is the target temperature of the wafer W, assuming that the elapsed time "t"=0, in the equation (12). The calculated temperature $T_h$ of the heater HT is the temperature of the heater HT at which the temperature of the wafer W reaches the target temperature.

In addition, the temperature calculator 102d may calculate the temperature $T_W$ of the wafer W at the current temperature $T_h$ of the heater HT from the equation (12). For example, the temperature calculator 102d calculates the temperature $T_W$ of the wafer W when the elapsed time "t"=0, at the current temperature 11 of the heater HT. Next, the temperature calculator 102d calculates a difference $\Delta T_W$ between the calculated temperature $T_W$ and the target temperature. Then, the temperature calculator 102d may calculate the temperature obtained by subtracting the difference $\Delta T_W$ from the current temperature $T_h$ of the heater HT, as the temperature of the heater HT at which the temperature of the wafer W reaches the target temperature.

The temperature calculator 102d corrects the set temperature of each heater HT in the heater controller 102a to the temperature of the heater HT at which the temperature of the wafer W reaches the target temperature.

The temperature calculator 102d calculates the temperature of the heater HT at which the temperature of the wafer W reaches the target temperature and corrects the set temperature of each heater HT, in a predetermined cycle. For example, each time the wafer W is replaced, the temperature calculator 102d calculates the temperature of the heater HT at which the temperature of the wafer W reaches the target temperature, and corrects the set temperature of each heater HT. In addition, for example, the temperature calculator 102d may calculate the temperature of the heater HT at which the temperature of the wafer W reaches the target temperature, and correct the set temperature of each heater HT, for each plasma processing.

As a result, the plasma processing apparatus 10 according to the present embodiment is able to accurately control the temperature of the wafer W to be the target temperature in the next plasma processing.

However, each plasma processing apparatus 10 may have a difference in characteristics inside the processing container 12. Thus, in another plasma processing apparatus 10, the temperature of the wafer W during the plasma processing may not be accurately controlled to be the target temperature, even by using the set temperature of each heater HT at which the temperature of the wafer W reaches the target temperature.

Thus, the plasma processing apparatus 10 according to the present embodiment calculates the heat flux $q_p$ and the heat resistance $R_{th}\cdot A$ according to the characteristics inside the own processing container 12. As a result, the plasma processing apparatus 10 according to the present embodiment is able to accurately control the temperature of the wafer W during the plasma processing to be the target temperature, even though each apparatus has a difference in characteristics inside the processing container 12.

In addition, in the plasma processing apparatus 10, the thermal characteristic of the stage 16 may change with time due to, for example, the wear of the electrostatic chuck 18.

Thus, the plasma processing apparatus 10 according to the present embodiment calculates the temperature of the heater HT at which the temperature of the wafer W reaches the target temperature and corrects the set temperature of each heater HT, in a predetermined cycle. As a result, the plasma processing apparatus 10 according to the present embodiment is able to accurately control the temperature of the wafer W during the plasma processing to be the target temperature, even though the thermal characteristic of the stage 16 changes with time.

In addition, the characteristics inside the processing chamber 12 may change due to, for example, the significant wear of the electrostatic chuck 18 or the adhesion of deposits, and as a result, the plasma processing apparatus 10 may go into an abnormal state which is not suitable for the plasma processing. Further, an abnormal wafer W may be carried into the plasma processing apparatus 10.

Thus, the output controller 102e performs a control to output an alert, based on a variation in at least one of the heat input amount and the heat resistance calculated by the parameter calculator 102c in the predetermined cycle. For example, the output controller 102e compares the heat flux $q_p$ and the heat resistance $R_{th}\cdot A$ calculated in the predetermined cycle, for each heater HT, and performs a control to output an alert when at least one of the heat flux $q_p$ and the heat resistance $R_{th}\cdot A$ varies by a predetermined allowable value or more. Further, the output controller 102e performs a control to output an alert when at least one of the heat flux $q_p$ and the heat resistance $R_{th}\cdot A$ calculated in the predetermined cycle is out of a predetermined allowable range. The alert may be output in any form as long as an abnormality may be notified to, for example, the process manager or the administrator of the plasma processing apparatus 10. For example, the output controller 102e displays a message notifying the user interface 103 of the abnormality.

As a result, the plasma processing apparatus 10 according to the present embodiment is able to notify the occurrence of an abnormality, when the characteristics inside the processing container 12 enter into an abnormal state or when an abnormal wafer W is carried in.

[Flow of Temperature Control]

Figure 8:
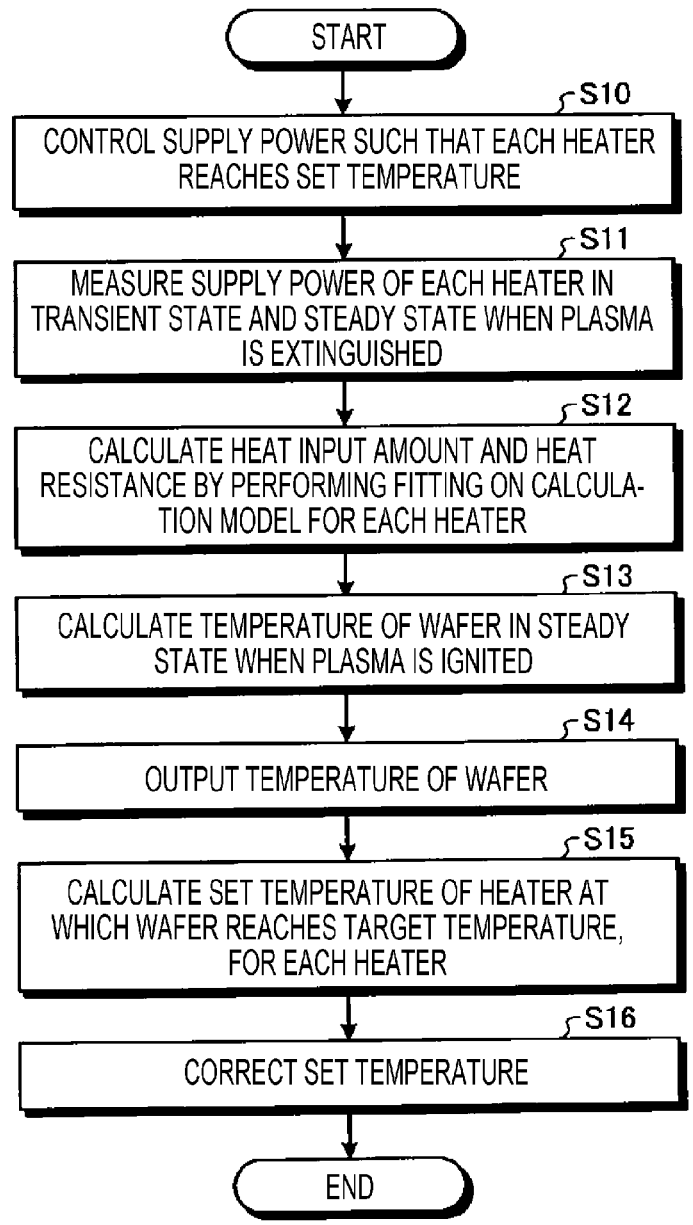
FIG. 8 is a view illustrating an example of a flow of a temperature control method according to an embodiment.

Next, a temperature control method using the plasma processing apparatus 10 according to the present embodiment will be described. FIG. 8 is a flowchart illustrating an example of the flow of the temperature control method according to the embodiment. The temperature control method is performed at a predetermined timing, for example, at a timing when the plasma processing is started.

The heater controller 102a controls the supply power supplied to each heater HT such that each heater HT has a set temperature (step S10).

While the heater controller 102a controls the supply power supplied to each heater HT such that the temperature of each heater HT reaches the constant set temperature, the measurement unit 102b measures the supply power supplied to each heater HT in the transient state when plasma is extinguished and the steady state when plasma is extinguished (step S11). For example, the measurement unit 102b measures the supply power supplied to each heater HT in the transient state when plasma is extinguished, as represented in the period T4 of FIGS. 5A and 5B. Further, the measurement unit 102b measures the supply power supplied to each heater HT in the steady state when plasma is extinguished, as represented in the period T5 of FIGS. 5A and 5B.

The parameter calculator 102c calculates the heat input amount and the heat resistance for each heater HT, by performing a fitting of the measurement results with respect to the calculation models (step S12). For example, the parameter calculator 102c calculates the heater power $P_{h\_off}$ in the steady state when plasma is extinguished, for each heater HT. The parameter calculator 102c divides the obtained heater power $P_{h\_off}$ by the area of each heater HT, so as to obtain the heat generation amount $q_{h\_}$off from the heater HT per unit area in the steady state when plasma is extinguished. Further, the parameter calculator 102c obtains the heater power Pio of the transient state in each elapsed time "t," for each heater HT. The parameter calculator 102c divides the obtained heater power $P_{h(t)}$ by the area of each heater HT, so as to obtain the heat generation amount $q_{h(t)}$ from the heater HT per unit area in the transient state for each elapsed time "t." Then, the parameter calculator 102c performs a fitting of the heat generation amount $q_{h(t)}$ and the heat generation amount $q_{h\_off}$ in each elapsed time "t," for each heater HT, using the equations (1) to (11) above as calculation models, so as to calculate the heat flux $q_{p\_on}$ and the heat resistance $R_{th} \cdot A$ at which an error is the smallest.

The temperature calculator 102d calculates the temperature of the wafer W in the steady state when plasma is ignited, using the calculated heat input amount and heat resistance, for each heater HT (step S13). For example, the temperature calculator 102d substitutes the calculated heat flux $q_p$ and heat resistance $R_{th} \cdot A$ into the equations (5), (6), and (12), for each heater HT. Then, the temperature calculator 102d calculates the temperature of the wafer W immediately after plasma is extinguished, assuming that the elapsed time "t"=0, from the equation (12) using $a_1$, $a_2$, $a_3$, $\lambda_1$, $\lambda_2$, $\tau_1$, and $\tau_2$ represented in the equations (5) to (11), for each heater HT.

As described above, the plasma processing apparatus 10 according to the present embodiment is able to accurately obtain the temperature of the wafer W during the plasma processing, by obtaining the heat input amount and the heat resistance.

The output controller 102e performs a control to output the temperature of the wafer W calculated by the temperature calculator 102d (step S14). For example, the output controller 102e outputs the temperature of the wafer W calculated by the temperature calculator 102d as the temperature of the wafer W when the plasma processing is performed on the wafer W, to the user interface 103.

As a result, the process manager is able to grasp whether the plasma processing has been performed on the wafer W at an appropriate temperature.

The temperature calculator 102d calculates the set temperature of each heater HT at which the wafer W reaches the target temperature in the steady state when plasma is ignited, using the calculated heat input amount and heat resistance (step S15). For example, the temperature calculator 102d calculates the temperature $T_h$ of the heater HT when $T_{W(t)}$ is the target temperature of the wafer W and when the elapsed time "t"=0 in the equation (12).

The temperature calculator 102d corrects the set temperature of each heater HT of the heater controller 102a to the temperature of the heater HT at which the temperature of the wafer W reaches the target temperature (step S16), and ends the process.

As a result, the plasma processing apparatus 10 according to the present embodiment is able to accurately control the temperature of the wafer W to the target temperature in the next plasma processing.

As described above, the plasma processing apparatus 10 according to the present embodiment includes the stage 16, the heater controller 102a, the measurement unit 102b, the parameter calculator 102c, and the temperature calculator 102d. The stage 16 is provided with the placing surface on which the wafer W to be subjected to the plasma processing is placed, and the heater HT capable of adjusting the temperature of the placing surface. The heater controller 102a controls the supply power supplied to the heater HT such that the heater HT reaches the set temperature. While the heater controller 102a controls the supply power supplied to each heater HT to make the temperature of the heater HT constant, the measurement unit 102b measures the supply power in the transient state (the transient state of the period T4 in FIGS. 5A and 5B) where the supply power supplied to the heater HT increases after the shifting to the state where plasma is extinguished from the first steady state where the supply power supplied to the heater HT becomes stable in the ignited state of plasma, and measures the supply power in the second steady state where the supply power supplied to the heater HT becomes stable in the extinguished state of plasma. The parameter calculator 102c calculates the heat input amount and the heat resistance by performing a fitting of the measured supply powers in the transient state and the second steady state, with respect to the calculation models that calculate the supply power in the transient state using the heat input amount from plasma and the thermal resistance between the wafer W and the heater HT, as parameters. The temperature calculator 102d calculates the temperature of the wafer W in the first steady state, using the heat input amount and the heat resistance calculated by the parameter calculator 102c. As a result, the plasma processing apparatus 10 is able to accurately obtain the temperature of the wafer W during the plasma processing.

In addition, the heater HT is individually provided for each divided region which is obtained by dividing the placing surface of the stage 16. The heater controller 102a controls the supply power supplied to each heater HT, such that the heater HT provided for each region has the set temperature set for each region. While the heater controller 102a controls the supply power to make the temperature of each heater HT constant, the measurement unit 102b measures the supply powers in the transient state and the second steady state for each heater HT. The parameter calculator 102c calculates the heat input amount and the heat resistance for each heater, by performing a fitting with respect to the calculation models using the supply powers in the transient state and the second steady state measured by the measurement unit 102b, for each heater HT. The temperature calculator 102d calculates the temperature of the wafer W in the first steady state for each heater HT, using the heat input amount and the thermal resistance calculated by the parameter calculator 102c. As a result, the plasma processing apparatus 10 is able to accurately obtain the temperature of the wafer W for each divided region obtained by dividing the placing surface.

Further, the plasma processing apparatus 10 according to the present embodiment further includes the output controller 102e. The measurement unit 102b measures the supply powers in the transient state and the second steady state in the predetermined cycle. The parameter calculator 102c calculates the heat input amount and the heat resistance, using the measured supply powers in the transient state and in the second steady state, in each predetermined cycle. The output controller 102e performs a control to output an alert, based on a variation in at least one of the heat input amount and the heat resistance calculated by the parameter calculator 102c. As a result, the plasma processing apparatus 10 is able to notify the occurrence of an abnormality when an abnormality occurs in the state of plasma, when the characteristics inside the processing chamber 12 enter into an abnormal state, or when an abnormal wafer W is carried in.

In addition, the temperature calculator 102d calculates the set temperature of the heater HT at which the wafer W reaches the target temperature in the first steady state, using the heat input amount and the heat resistance calculated by the parameter calculator 102c, and corrects the set temperature in the heater controller 102a to the calculated set temperature. As a result, the plasma processing apparatus 10 according to the present embodiment is able to accurately control the temperature of the wafer W to the target temperature in the next plasma processing.

For example, in the embodiment described above, the plasma processing is performed on the semiconductor wafer which is an example of the workpiece. However, the present disclosure is not limited thereto. The workpiece may be any object as long as the progress of the plasma processing is affected by a temperature.

In addition, the embodiment described above, for example, the plasma etching is performed as the plasma processing. However, the present disclosure is not limited thereto. The plasma processing may be any processing as long as the progress of the processing is affected by a temperature.

According to the present disclosure, it is possible to accurately obtain the temperature of a target object during plasma processing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a stage having a placing surface on which a workpiece is accommodated to be subjected to a plasma processing;
a heater provided in the stage and configured to adjust a temperature of the placing surface of the stage; and
a controller that controls an overall operation of the plasma processing apparatus and configured to:
control a supply power to the heater such that the heater has a set temperature;
while the supply power to the heater is controlled to make the temperature of the heater constant, measure the supply power in a transient state where the supply power to the heater increases over time after a shifting to a state where the plasma is extinguished from a first steady state where the supply power to the heater is stable in an ignited state of plasma, and in a second steady state where the supply power to the heater is stable in an extinguished state of plasma;
calculate a heat input amount and a heat resistance by performing a fitting, using the supply power in the transient state and the second steady state, on a calculation model that calculates the supply power in the transient state using the heat input amount from the plasma and the heat resistance between the workpiece and the heater as parameters; and
calculate a temperature of the workpiece in the first steady state, using the heat input amount and the heat resistance.

2. The plasma processing apparatus according to claim 1, wherein the heater is individually provided in each divided region obtained by dividing the placing surface of the stage, and
the controller is configured to:
control the supply power to the heater such that the heater provided in each divided region reaches the set temperature set for the divided region;
measure the supply power in the transient state and the second steady state for the individual heater, while the supply power is controlled to make the temperature of the individual heater constant;
calculate the heat input amount and the heat resistance for the individual heater, by performing a fitting on the calculation model, using the supply power in the transient state and the second steady state; and
calculate the temperature of the workpiece in the first steady state for the individual heater, using the heat input amount and the heat resistance.

3. The plasma processing apparatus according to claim 2, wherein the controller is configured to:
measure the supply power in the transient state and the second steady state, in a predetermined cycle;
calculate the heat input amount and the heat resistance, using the measured supply power in the transient state and the second steady state, in the predetermined cycle; and
output an alert, based on a variation in at least one of the heat input amount and the heat resistance.

4. The plasma processing apparatus according to claim 3, wherein the controller calculates the set temperature of the heater at which the workpiece reaches a target temperature in the first steady state, using the heat input amount and the heat resistance, and corrects the set temperature to the calculated set temperature.

5. The plasma processing apparatus according to claim 1, wherein the controller is configured to:
measure the supply powers in the transient state and the second steady state in a predetermined cycle;
calculate the heat input amount and the heat resistance, using the measured supply powers in the transient state and the second steady state in the predetermined cycle; and
output an alert, based on a variation in at least one of the heat input amount and the heat resistance.

6. The plasma processing apparatus according to claim 1, wherein the controller calculates the set temperature of the heater at which the workpiece reaches a target temperature in the first steady state, using the heat input amount and the heat resistance, and corrects the set temperature to the calculated set temperature.

7. The plasma processing apparatus of claim 1, wherein the transient state is the state in which a temperature of the workpiece has a decreasing tendency.

8. A method of controlling a temperature, the method comprising:
while a supply power to a heater provided in a placing surface of a stage on which a workpiece is accommodated to be subjected to a plasma processing and capable of adjusting a temperature of the placing surface is controlled such that a temperature of the heater reaches a set temperature, measuring the supply power in a transient state where the supply power to the heater increases over time after a shifting to a state where plasma is extinguished from a first steady state where the supply power to the heater is stable in an ignited state of plasma, and in a second steady state where the supply power to the heater is stable in an extinguished state of plasma;
calculating a heat input amount and a heat resistance by performing a fitting, using the measured supply power in the transient state and the second steady state, on a calculation model that calculates the supply power in the transient state using the heat input amount from the plasma and the heat resistance between the workpiece and the heater as parameters; and calculating a temperature of the workpiece in the first steady state, using the calculated heat input amount and heat resistance.

9. A non-transitory computer-readable storage medium having stored therein a program that causes a computer to execute a temperature control process including:

while a supply power to a heater provided in a placing surface of a stage on which a workpiece is accommodated to be subjected to a plasma processing and capable of adjusting a temperature of the placing surface is controlled such that a temperature of the heater reaches a set temperature, measuring the supply power in a transient state where the supply power to the heater increases over time after a shifting to a state where plasma is extinguished from a first steady state where the supply power supplied to the heater is stable in an ignited state of plasma, and in a second steady state where the supply power to the heater is stable in an extinguished state of plasma;

calculating a heat input amount and a heat resistance by performing a fitting, using the measured supply power in the transient state and the second steady state, on a calculation model that calculates the supply power in the transient state using the heat input amount from the plasma and the heat resistance between the workpiece and the heater as parameters; and calculating a temperature of the workpiece in the first steady state, using the calculated heat input amount and heat resistance.

* * * * *